United States Patent
Negoro et al.

(10) Patent No.: US 7,262,447 B2
(45) Date of Patent: Aug. 28, 2007

(54) METAL OXIDE SILICON TRANSISTOR AND SEMICONDUCTOR APPARATUS HAVING HIGH λ AND β PERFORMANCES

(75) Inventors: Takaaki Negoro, Hyogo-Ken (JP); Akira Shimizu, Hyogo-Ken (JP)

(73) Assignee: Ricoh Company, Ltd., Tokyo (JP)

( * ) Notice: Subject to any disclaimer, the term of this patent is extended or adjusted under 35 U.S.C. 154(b) by 152 days.

(21) Appl. No.: 10/780,699

(22) Filed: Feb. 19, 2004

(65) Prior Publication Data
US 2004/0183119 A1 Sep. 23, 2004

(30) Foreign Application Priority Data
Feb. 19, 2003 (JP) .............................. 2003-041196

(51) Int. Cl.
*H01L 29/80* (2006.01)
*H01L 31/112* (2006.01)

(52) U.S. Cl. ...................... 257/266; 257/270; 257/392; 257/E29.021

(58) Field of Classification Search ................ 257/392, 257/266, 270, E29.021
See application file for complete search history.

(56) References Cited

U.S. PATENT DOCUMENTS

| | | | | |
|---|---|---|---|---|
| 3,877,055 A | * | 4/1975 | Fisher et al. | 257/326 |
| 5,401,987 A | * | 3/1995 | Hiser et al. | 257/204 |
| 6,121,666 A | * | 9/2000 | Burr | 257/408 |

FOREIGN PATENT DOCUMENTS

| | | |
|---|---|---|
| JP | 08-274330 | 10/1996 |
| JP | 10-178102 | 6/1998 |

* cited by examiner

*Primary Examiner*—Phat X. Cao
(74) *Attorney, Agent, or Firm*—Dickstein Shapiro LLP

(57) ABSTRACT

A semiconductor apparatus includes a MOS transistor having a semiconductor substrate providing as a channel region between a source and a drain. A gate electrode is formed on the semiconductor substrate via a gate oxide film. A threshold voltage of the source side region of the MOS transistor is higher than that of the drain side region in a longitudinal direction of the channel region so that a saturation drain current can be constant and a λ performance can be improved while suppressing channel width and length.

5 Claims, 12 Drawing Sheets

FIG.14

TABLE 1

| | SOURCE SIDE Vth −0.65V | DRAIN SIDE Vth −0.35V | DRAIN SIDE Vth +0.20V | λ PERFORMANCE (A/V) |
|---|---|---|---|---|
| COMPARATIVE EXAMPLE 1 | 2.0 μm | NOTHING | NOTHING | $157 \times 10^{-9}$ |
| COMPARATIVE EXAMPLE 2 | 10.0 μm | NOTHING | NOTHING | $35.4 \times 10^{-9}$ |
| PRACTICAL EXAMPLE 1 | 2.0 μm | 2.0 μm | NOTHING | $9.93 \times 10^{-9}$ |
| PRACTICAL EXAMPLE 2 | 2.0 μm | 10.0 μm | NOTHING | $33.2 \times 10^{-9}$ |
| PRACTICAL EXAMPLE 3 | 2.0 μm | NOTHING | 10.0 μm | 0 (NO CHANGE) |

FIG. 15

TABLE 2

| | GATE ELECTRODE | | λ PERFORMANCE (A/V) | β PERFORMANCE ($\mu A/V^2$) |
|---|---|---|---|---|
| | SOURCE SIDE (P TYPE) | DRAIN SIDE (N TYPE) | | |
| COMPARATIVE EXAMPLE | 50 $\mu$m | NOTHING | $3.80 \times 10^{-9}$ | 27.6 |
| PRACTICAL EXAMPLE 1 | 10 $\mu$m | 40 $\mu$m | $3.03 \times 10^{-10}$ | 145.0 |
| PRACTICAL EXAMPLE 2 | 20 $\mu$m | 30 $\mu$m | $9.61 \times 10^{-11}$ | 69.2 |
| PRACTICAL EXAMPLE 3 | 30 $\mu$m | 20 $\mu$m | 0 (NO CHANGE) | 44.9 |
| PRACTICAL EXAMPLE 4 | 40 $\mu$m | 10 $\mu$m | 0 (NO CHANGE) | 33.1 |

METAL OXIDE SILICON TRANSISTOR AND SEMICONDUCTOR APPARATUS HAVING HIGH λ AND β PERFORMANCES

This application claims priority under 35 U.S.C. § 119 to Japanese Patent Application No. 2003-041196, filed on Feb. 19, 2003, the entire contents of which are herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

The present specification relates generally to a MOS (Metal Oxide Semiconductor) transistor and a semiconductor apparatus employing a MOS transistor, and more particularly to a MOS transistor and such a semiconductor apparatus having various threshold voltages.

2. Discussion of the Related Art

It is known that a MOS transistor can be operated in a saturation range. When so operated, drain current variation due to a drain voltage variation is relatively small. This insensitivity of drain current to drain voltage is useful in a constant current source used in a differential amplifier circuit as well as in a MOS transistor section included in a current mirror circuit. These applications generally require small variations in current value corresponding to a change in a power source voltage. Such performance is also required when a MOS transistor operates as a reference current source.

In this regard, a MOS transistor should generally have a small channel length variation effect, i.e., an excellent λ performance. Such a channel length variation effect (λ) is a phenomenon in which drain current increases when a drain side depletion layer extends to a source side as a drain voltage increases. According to the channel length variation effect, an effective channel length becomes shorter during operation of the transistor in saturation. To achieve good λ performance, a MOS transistor is conventionally designed with extremely long effective channel length.

However, a MOS transistor with long effective channel length is unsuitable when for flowing a significant current. In addition, a MOS transistor used in a differential amplifier circuit is required to have a current value varying widely (i.e., a β performance) in relation to changes in gate voltage. Accordingly, a channel width of the transistor might be adjusted wider in proportion to an increase in effective channel length. As a result, a differential amplifier circuit having a high performance necessarily needs a large channel area. Thus, a designer may be required to compromise transistor performance to achieve limited channel size.

In view of such a problem, a MOS transistor excellent in both the λ and β performances, the requirements of which are conflicting to each other, has been demanded even in a small area. Further, such a MOS transistor has been demanded in an enhancement type transistor, a depletion type transistor, a Pch-MOS transistor, an Nch-MOS transistor, and the like.

When MOS transistors are designed to include various threshold voltages on the same semiconductor substrate, threshold voltages are differentiated based upon the thicknesses of gate oxide films, or densities of impurity in channel regions which in turn are determined by the amount of channel regions beneath a gate oxide film.

For example, the gate oxide film is typically formed in different thicknesses in the plurality of regions forming MOS transistors. Specifically, a silicon oxide film is formed on a surface of a semiconductor substrate. A silicon nitride film is then formed on the silicon oxide film in an element device formation region. Then, an element device separation film is formed using a LOCOS (Local Oxidation of Silicon) method. A resist film having an opening is then formed at a position corresponding to an element device formation region that forms a first gate oxide film. Silicon nitride and silicon oxide films in the openings are removed using the resist film. Then, a first gate oxide film is selectively formed by thermal oxidation. After removal of the silicon nitride and silicon oxide films within the element device formation region forming a second gate oxide film, the second gate oxide film is selectively formed to a different thickness from that of the first gate oxide film as discussed in Japanese Patent application Laid Open No. 10-178102.

An exemplary method of varying the density of impurities in channel regions by changing a channel dopant value in a plurality of element device formation regions is discussed in Japanese Patent Application Laid Open No. 08-274330. Specifically, a pair of channel regions is disposed in element device formation regions having a first impurity density and a second impurity density. The first impurity density is determined by a surface density of a P-type semiconductor substrate. The second impurity density is determined by implementation of impurity performed by ion implantation or the like into a region selected by a pattern of an impurity implementation use mask. In addition, each of the channel regions of the first and second impurity densities is divided into a plurality of planar shapes. As shown in the impurity implementation use mask used when ion is implanted and a channel region having a second impurity density is formed, a planar area ratio between channel regions of the first and second impurity densities and a channel dope value given to the channel region are changed by changing the pattern at a plurality of element device formation regions.

SUMMARY

Accordingly, an object of the present invention is to address and resolve such problems and provide a new semiconductor apparatus including a MOS transistor. Such a novel semiconductor apparatus includes a MOS transistor a semiconductor substrate to provide a channel region between a source and a drain and a gate electrode formed on the semiconductor substrate via a gate oxide film. In the preferred embodiment, a threshold voltage of a source side region of the MOS transistor is higher than that of a drain side region in a longitudinal direction of the channel region.

In another embodiment, the threshold voltage of the source side region is designed higher by differentiating the source and drain side regions with respect to a density of channel impurity in the channel longitudinal direction.

In yet another embodiment, the threshold voltage of the source side region is designed higher by differentiating the gate electrode in the source and drain side regions with respect to a work function in the channel longitudinal direction.

In still yet another embodiment, the threshold voltage of the source side region is designed higher by differentiating the gate oxide film in the source and drain side regions in a film thickness in the channel longitudinal direction.

BRIEF DESCRIPTION OF THE DRAWINGS

A more complete appreciation of the present invention and many of the attendant advantages thereof will be readily obtained as the same becomes better understood by the following detailed description when considered in connection with the accompanying drawings, wherein:

FIG. 14 illustrates Table 1 showing $\lambda$ performance data; and

FIG. 15 illustrates Table 2 showing $\lambda$ and $\beta$ performance data.

PREFERRED EMBODIMENTS OF THE PRESENT INVENTION

Figure 1A:
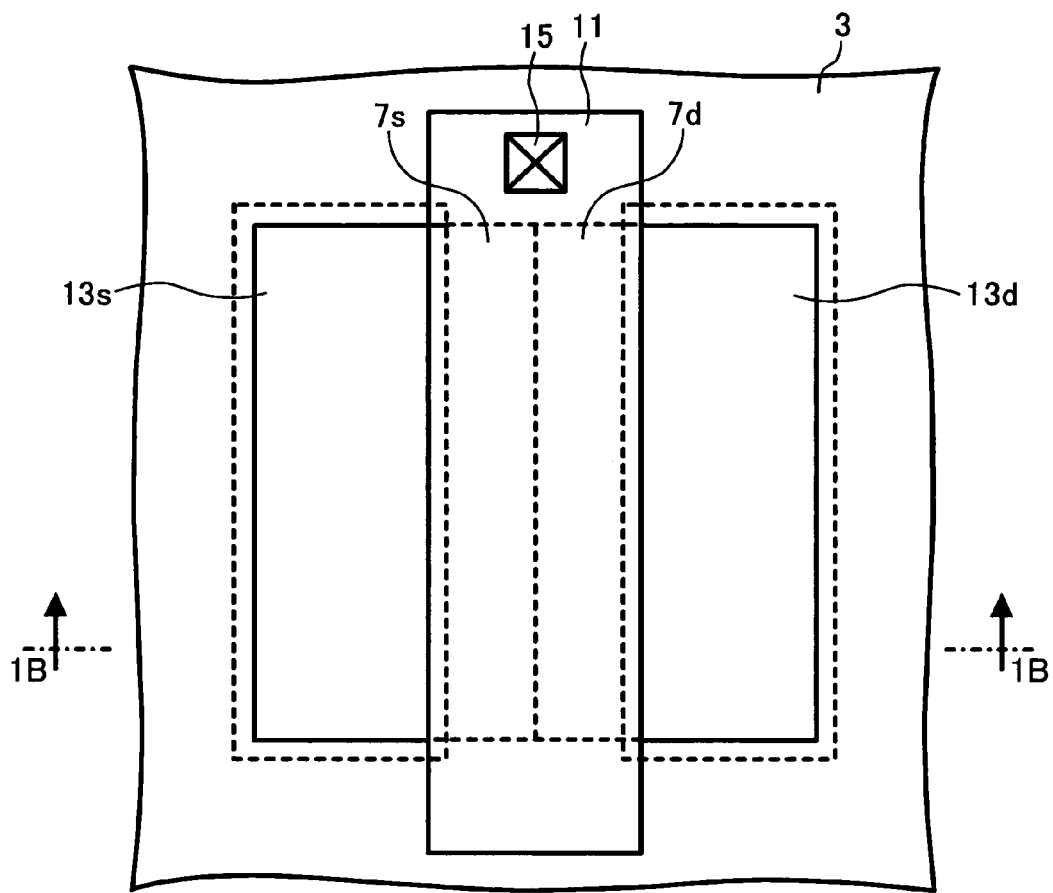
FIG. 1A is a plan view of an exemplary semiconductor apparatus, according to one embodiment of the present invention.
Figure 1B:
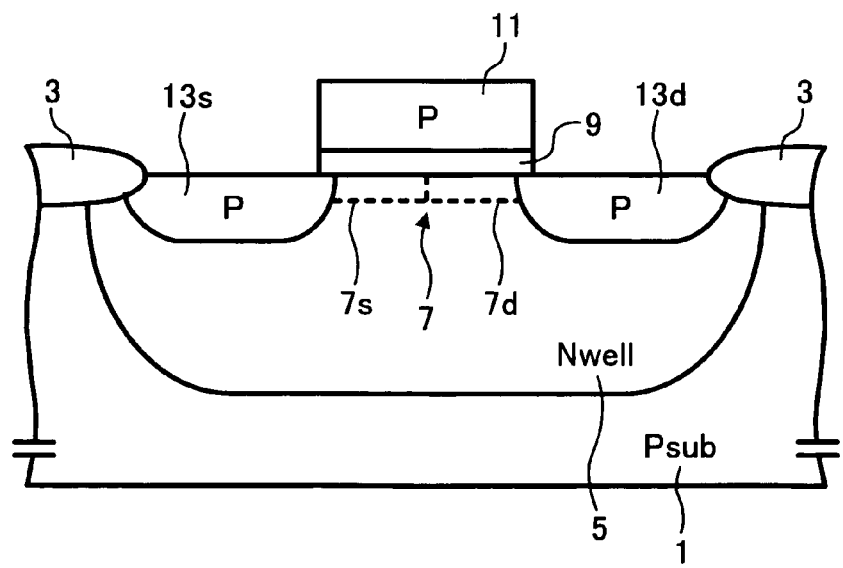
FIG. 1B is a sectional view of the exemplary semiconductor apparatus when viewed along the line 1B-1B illustrated in FIG. 1A.

Referring now to the drawings, wherein like reference numerals designate identical or corresponding parts throughout several views, in particular to FIGS. 1A and 1B, an exemplary embodiment of the present invention includes a LOCOS oxide film 3 formed on a surface of a P-type semiconductor substrate 1 in order to separate an element device formation region in a Pch-MOS transistor. An N-well region 5 is preferably formed in the element device formation region of the semiconductor substrate 1. A gate oxide film 9 made of silicon is formed on a channel region 7 on a surface of the N-well region 5. An annular gate electrode 11 made of poly-silicon having implanted P-type impurity is preferably formed on the gate oxide film 9 while extending to the LOCOS oxide film 3. A source 13s and a drain 13d each receiving implantation of P-type impurity are preferably formed at both sides of the channel region 7 on the surface of the N-well region 5. An ohmic contact region 15 may be formed on the LOCOS oxide film 3 on the gate electrode 11.

A channel impurity density of the channel region 7 varies in a longitudinal direction of the channel at regions 7s and 7d of the source and drain sides 13s and 13d, respectively. A threshold voltage of the region 7s of the source 13s side may be higher than that of the region 7d of the drain 13d side.

Given that MOS transistors are formed both in the regions 7d and 7s, respectively, it can be assumed that the MOS transistor (i.e., a former one) with a high current drive performance of the drain 13d side is serially connected to that (i.e., a latter one) with a low current drive performance of the source 13s side. In such a situation, the former MOS transistor may necessarily receive current limitation in accordance with the current drive performance of the latter MOS transistor. Simultaneously, some amount of voltages may appear in the source of the former MOS transistor as a back bias in order to decrease a current. The voltage may be a drain voltage of the latter MOS transistor, and is substantially fixed in a saturation range unless the gate voltage changes. Thus, even when the drain voltage changes, that of the latter MOS transistor does not change. Thereby, a saturation drain current is held constant, and the $\lambda$ performance is improved.

Table 1, illustrated in FIG. 14, describes $\lambda$ performance (e.g., Ampere/Volt) when a channel length of the region 7d and a threshold voltage (i.e., a density of channel impurity) are changed. In Comparative Examples 1 and 2, only region 7s is formed, while region 7d is omitted. The channel impurity may be a prescribed level enabling the threshold voltage (source side Vth) of the region 7s to be −0.65 volt, and threshold voltage (drain side Vth) of the region 7d to be −0.35 or +0.20 volts.

As shown, in the first practical example the channel length of the region 7s amounts to 2.0 μm and that of the region 7d is 2.0 μm, while its drain side threshold voltage "Vth" is −0.35 volts. In Practical Example 2, the channel length of the region 7s is 2.0 μm and that of the region 7d is 10.0 μm, while its drain side threshold voltage Vth amounts to −0.35 volts. Hence, λ performance is improved when compared with comparative examples 1 and 2 in which only the region 7s has a channel length of 2.0 μm and 10.0 μm, respectively.

Figure 2:
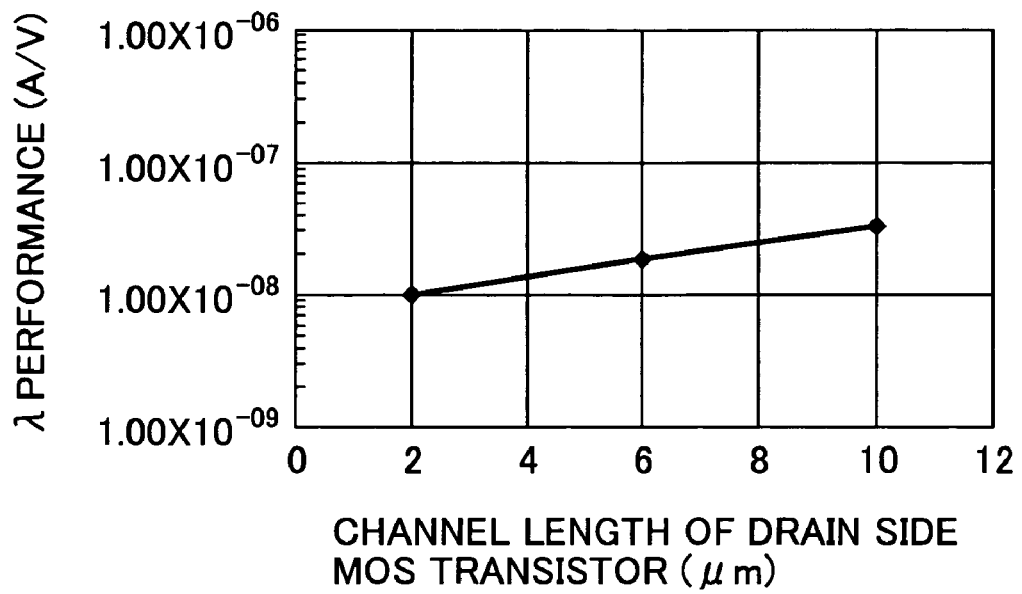
FIG. 2 illustrates a relation between a channel length and a $\lambda$ performance of a drain side MOS transistor.

FIG. 2 illustrates a relation between a channel length and a λ performance of the drain side MOS transistor in which a difference in a threshold voltage between the former (drain side) and latter (source side) MOS transistors is 0.3 volts and the channel length of the latter MOS transistor is 2.0 μm. The vertical axis represents the λ performances, and the lateral axis the channel length (μm) of the former MOS transistor, respectively.

As readily understood from the comparison between the first and second practical examples listed on Table 1 as well as FIG. 2, the λ performance is preferable in proportion to the current drive performance of the former MOS transistor. Specifically, the better the λ performance (A/V), the shorter the channel length is. This may suggest that the entire channel length (i.e., the gate length) and a region forming a MOS transistor can be minimized.

Figure 3:
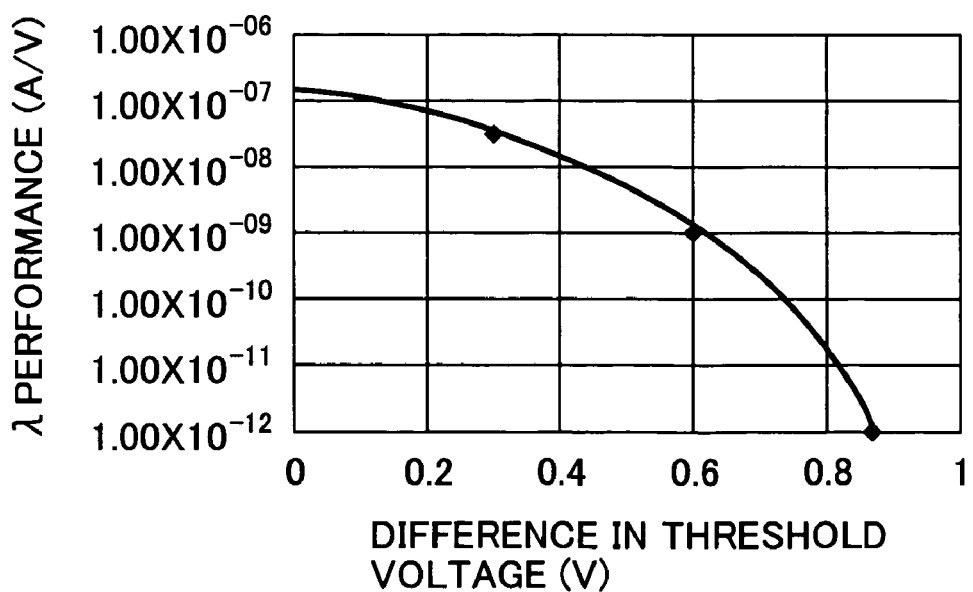
FIG. 3 illustrates a relation between a difference in a threshold voltage between source and drain side MOS transistors and a $\lambda$ performance.

FIG. 3 also illustrates a relation between a difference in a threshold voltage between the former (drain side) and latter (source side) MOS transistors and a λ performance on condition that the channel length of the former and latter MOS transistors is 10.0 μm and 2.0 μm, respectively. The vertical axis represents the λ performance (A/V), and the lateral axis, the threshold voltage difference (V), respectively.

As readily understood from the comparison between the first and second examples in Table 1 as well as FIG. 3, the larger the difference in the threshold voltage between former and latter MOS transistors (i.e., the higher the current drive performance of the former MOS transistor), the greater the improvement of the λ performance.

Even if the Pch-MOS transistor constitutes the preferred embodiment of FIG. 1, an Nch-MOS transistor can also constitute the preferred embodiment with substantially the same effect if a threshold voltage in a source side region is designed higher than that of a drain side region in a channel longitudinal direction by differentiating densities of channel impurity in the source and drain sides of a channel region.

Another exemplary embodiment of the present invention is now described with reference to FIGS. 4A and 4B.

As shown, a LOCOS oxide film 3 is preferably formed on a surface of a P-type semiconductor substrate 1. A P-well region 17 is preferably formed on an element device formation region on the P-type semiconductor substrate 1. An annular gate electrode 21 made of poly-silicon is preferably formed on a channel region 19 on a surface of the P-well region 17 via a gate oxide film 9 while extending to the LOCOS oxide film 3. A source 23s and a drain 23d each receiving implantation of N-type impurity are formed in both sides of the channel region 19 on the surface of the P-well region 17.

The gate electrode 21 is preferably separated into two regions in a longitudinal direction (i.e., a channel width direction) in accordance with a conduction type of implanted impurity, and is accordingly formed from an N-type region 21d in the drain 23d side and a P-type region 21s in the source 23s side. An ohmic contact region 15 is preferably formed on the gate electrode on the LOCOS oxide film 3 while extending to the N and P-type regions 21d and 21s.

Since the channel region 19 is the P-type, a region corresponding to the P-type region 21s of the gate electrode 21 has a larger work function (a factor of determining a threshold voltage and representing a difference in a work function between metal and semiconductor) in comparison with that corresponding to the N-type region 21d. Further, substantially the same voltages are applied to the N and P-type regions 21d and 21s via the ohmic contact region 15. Accordingly, the threshold voltage of the region corresponding to the P-type region 21s is higher than that of the region corresponding to the N-type region 21d.

Assuming that MOS transistors are formed in the regions corresponding to N and P-type regions 21d and 21s, respectively, it can be assumed that the MOS transistor with a high current drive performance of the drain 23d side is serially connected to that with a low current drive performance of the source 23s side. As a result, the λ performance can be improved as in the former embodiment by the same reason as described with reference to FIGS. 1A and 1B Table 2 illustrated in FIG. 15 describes λ and β performances when a length ratio between the N and P type regions 21d changes in a channel longitudinal direction of the gate electrode 21 of the Nch-MOS transistor. In the Comparative Example of Table 2, only the P-type region 21s is formed while excluding the N-type region 21d.

Referring to Practical Example 1 of Table 2, in which P-type region 21s is 10 μm and N-type region 21d is 40 μm, λ performance is improved when compared with the Comparative Example only having the P-type region 21s of 50 μm. Further, in Practical Example 2, in which P-type region 21s is 20 μm and N-type region 21d is 30 μm, λ performance is improved when compared with the Comparative Example. Still larger improvements are obtained in Practical Examples 3 and 4, wherein the P-type region 21s is 30 μm and N-type region 21d is 20 μm, and the P-type region 21s is 40 μm and N-type region 21d is 10 μm, respectively. The βperformances of the practical examples 1 to 4 are each inferior to that of the Comparative Example. However, it is understood that the performances are improved as the N-type region 21d is shortened.

Figure 4A:
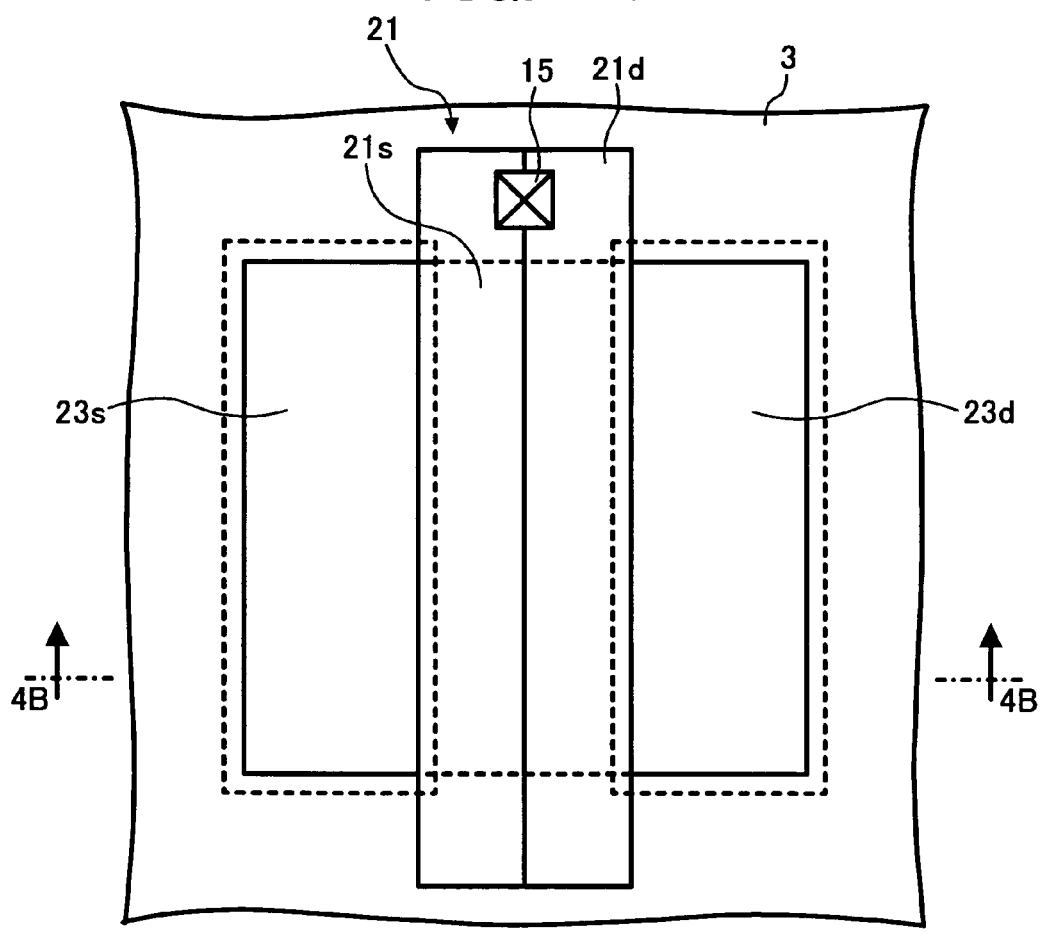
FIG. 4A is a plan view of an exemplary semiconductor apparatus, according to another embodiment of the present invention.
Figure 4B:
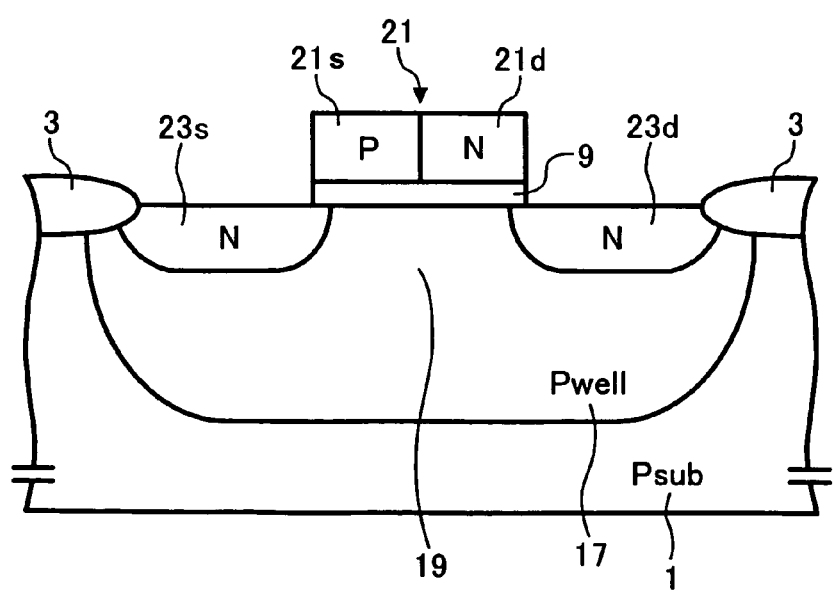
FIG. 4B is a sectional view of the exemplary semiconductor apparatus when viewed along the line 4B-4B illustrated in FIG. 4A.

The exemplary embodiment of FIGS. 4A and 4B is realized in the form of an Nch-MOS transistor. However, a Pch-MOS transistor can also be realized with similar effect if a threshold voltage of a source side region is designed higher than that of a drain side region in a channel longitudinal direction by differentiating the source and drain sides of the gate electrode in a work function.

Figure 5A:
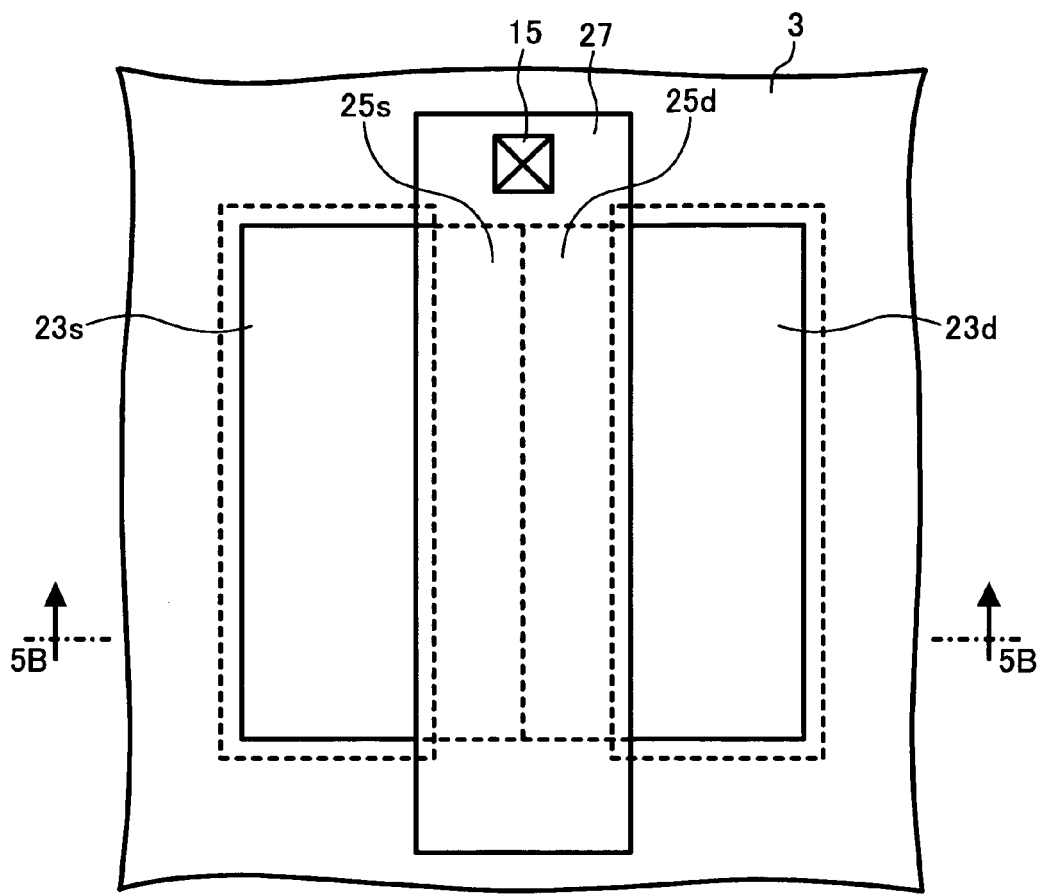
FIG. 5A is a plan view of an exemplary semiconductor apparatus, according to still another embodiment of the present invention.
Figure 5B:
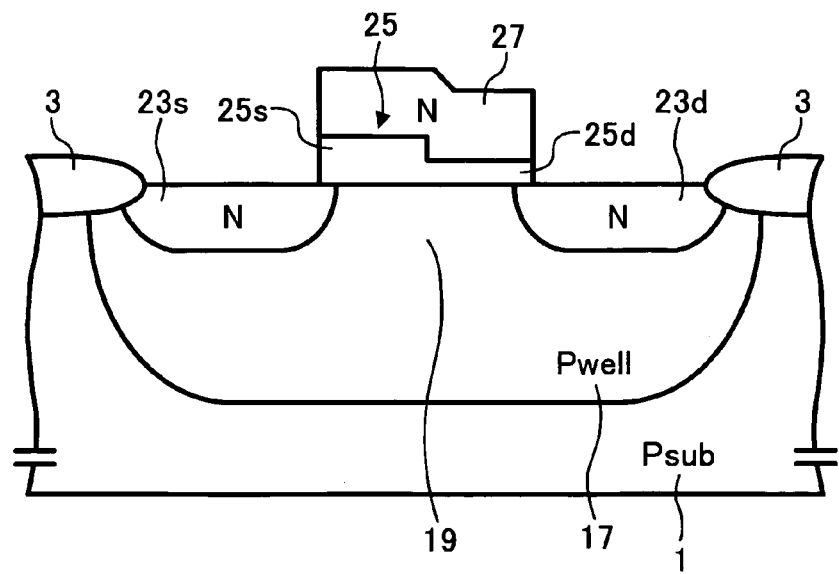
FIG. 5B is a sectional view of the exemplary semiconductor apparatus when viewed along the line 5B-5B illustrated in FIG. 5A.

With reference to FIGS. 5A and 5B, a further exemplary embodiment is now described, in which the present invention is realized in an Nch-MOS transistor.

Specifically, a LOCOS oxide film 3 is formed on a surface of a P-type semiconductor substrate 1. A gate oxide film 25 made of silicon is preferably formed on a surface of a channel region 19 formed on a surface of a P-well region 17. A belt like gate electrode 27 made of poly-silicon receiving implantation of N-type impurity is preferably formed in the gate oxide film 25 while extending to the LOCOS oxide film 3. A source 23s and a drain 23d each having implanted N-type impurity are preferably formed at both sides of the channel region 19 on the surface of the P-well region 17. An ohmic contact region 15 is formed on the gate electrode 27 on the LOCOS oxide film 3.

A region 25s of the source 23s side of the gate oxide film 25 is different in film thickness from a region 25d of the source side 23d in a channel longitudinal direction. Specifically, the film thickness of the region 25s is thicker than that of the region 25d. Accordingly, in the MOS transistor, the region corresponding to the region 25s has a higher threshold voltage than that of the region corresponding to the region 25d.

Provided that MOS transistors are formed both in the regions corresponding to the regions 25d and 25s, respectively, it can be assumed that the MOS transistor with a high current drive performance of the drain 23d side is serially connected to that with a low current drive performance of the source 23s side. As a result, the λ performance can be similarly improved to the embodiments described with reference to FIGS. 1A, 1B, 4A, and 4B.

Even if the Nch-MOS transistor constitutes the exemplary embodiment shown in FIG. 5, an Pch-MOS transistor can also constitute the preferred embodiment with substantially the same effect if a threshold voltage of a source side region is designed higher than that of a drain side region in a channel longitudinal direction by differentiating source and drain sides of a gate oxide film in a film thickness in a channel longitudinal direction.

Hence, as illustrated in FIGS. 1A, 1B, 4A, 4B, 5A, and 5B, the impurities are differentiated between the source and drain sides of the channel region in the channel longitudinal direction, the regions of different work functions are employed between the source and drain sides of the gate electrode in the channel longitudinal direction, and the film thicknesses are differentiated between the source and drain sides of the gate oxide film in the channel longitudinal direction, respectively.

However, a threshold voltage of a drain side region can be designed higher than that of a source side in a channel longitudinal direction by optionally combining two or more constructions mentioned above.

Figure 6A:
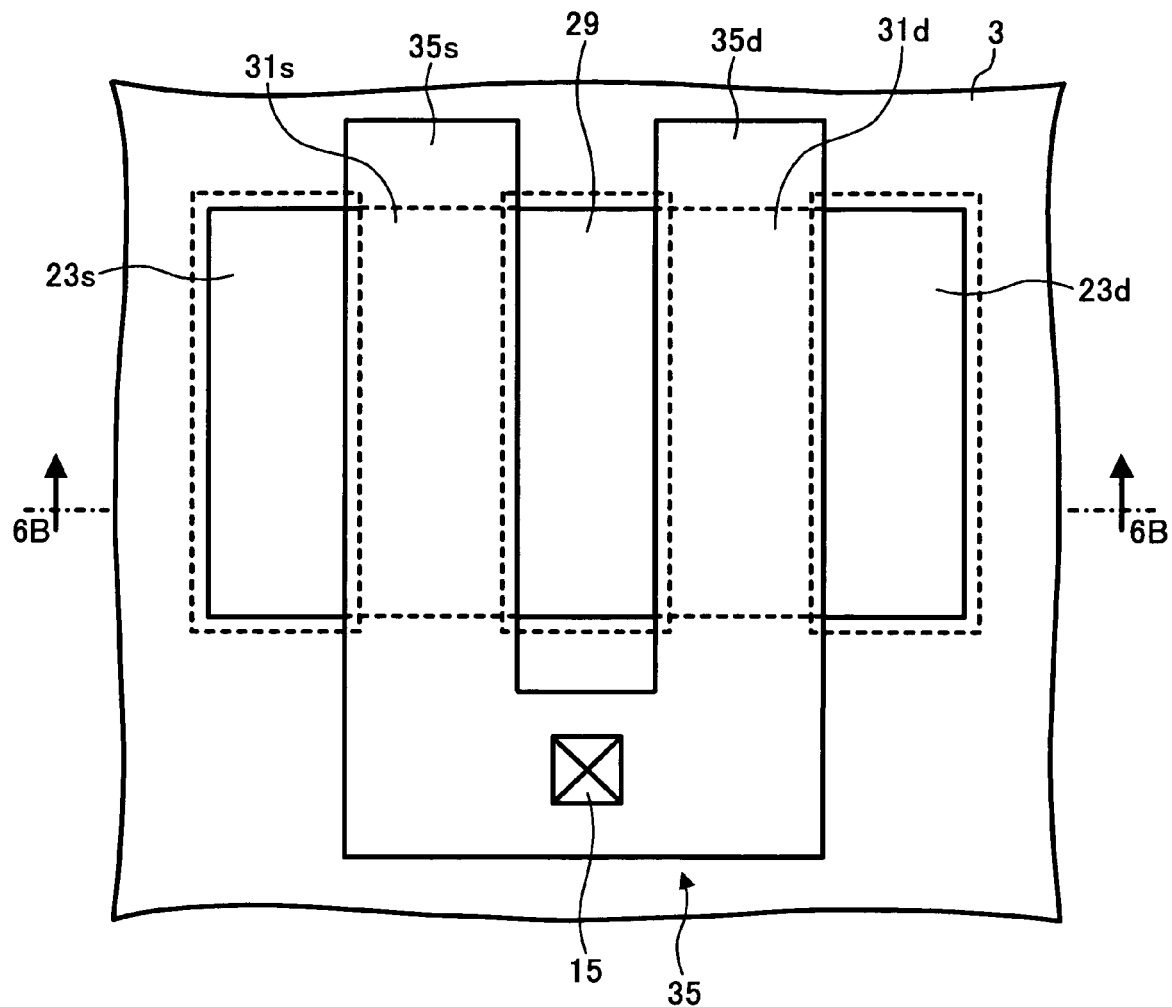
FIG. 6A is a plan view of an exemplary semiconductor apparatus, according to an embodiment of the present invention.

Still another exemplary embodiment is now described with reference to FIG. 6, wherein the present invention is realized in an Nch-MOS transistor.

As shown, a LOCOS oxide film 3 is preferably formed on a surface of a P-type semiconductor substrate 1. A P-well region 17 is preferably formed in an element device formation region of the semiconductor substrate 1. A source 23s and a drain 23d each receiving implantation of N-type impurity are separately formed on a surface of the P-well region 17. An N-type impurity diffusion zone 29 with implantation of N-type impurity is preferably formed on the surface of the P-well region 17 being distanced from the source 23s and drain 23d therebetween.

A drain side gate oxide film 33d formed from a silicon oxide film is preferably formed on a P-well region 17 between the drain 23d and the N-type impurity diffusion zone 29 to serve as a drain side channel region 31d. A source side gate oxide film 33s made of silicon is preferably formed on the P-well region 17 between the source 23s and the N-type impurity diffusion zone 29 so as to serve as a source side channel region 31s. The thickness of the LOCOS oxide film 3 separating the element device formation region from the other on the surface of the P-type semiconductor substrate 1 and that of the gate oxide films 33d and 33s are substantially the same, for example.

An annular drain side gate electrode 35d made of poly-silicon receiving implantation of P-type impurity is preferably formed on the gate oxide film 33d while extending to the LOCOS oxide film 3. An annular source side gate electrode 35s made of poly-silicon receiving implantation of N-type impurity is preferably formed on the gate oxide film 33s while extending to the LOCOS oxide film 3. The gate electrodes 35d and 35s are preferably continuously formed on the LOCOS oxide film 3 so as to form the gate electrode 35. An ohmic contact region 15 may be formed on the gate electrode 35 on the LOCOS oxide film 3. Substantially the same voltages are preferably applied to the gate electrodes 35d and 35s.

The drain side channel region 31d and source side channel region 31s are differentiated in a density of channel impurity. The threshold voltage of the source side MOS transistor that is formed from an N-type impurity diffusion zone 29, the source 23s, the channel region 31s, the gate oxide film 33s, and the gate electrode 35s is higher than that of the drain side MOS transistor formed from the drain 23d, the N-type impurity diffusion zone 29, the channel region 31d, the gate oxide film 33d, and the gate electrode 35d.

Hence, it is understood from this embodiment that the MOS transistor with a high current drive performance of the drain side is serially connected to that with a low current drive performance of the source side while commonly using the N-type impurity diffusion zone 29. In such a situation, since the drain side MOS transistor receives current limitation in accordance with the current drive performance of the source side MOS transistor and decreases in a current, a voltage is generated at the source (N-type impurity diffusion zone 29) of the drain side MOS transistor as a back bias. The voltage impressed onto the N-type impurity diffusion zone 29 may be a drain voltage of the source side MOS transistor, and is substantially fixed in a saturation range unless the gate voltage changes. Thus, even if the drain voltage applied to the drain 23d changes, the voltage applied to the drain (i.e., the N-type impurity diffusion zone 29) of the source side MOS transistor does not change. Thereby, a saturation drain current can be constant, and the λ performance can be improved.

Further, since the gate electrode 35 is preferably separately formed in the drain side gate electrode 35d and the source side gate electrode 35s, and the drain side channel region 31d and the source side channel region 31s are distanced from each other, an unevenness of a performance likely caused by displacement of photoengraving can be omitted, or at least further minimized as compared to the embodiment of FIG. 1 that employs the common gate electrode and two neighboring channel regions with different densities of channel impurities.

Figure 7A:
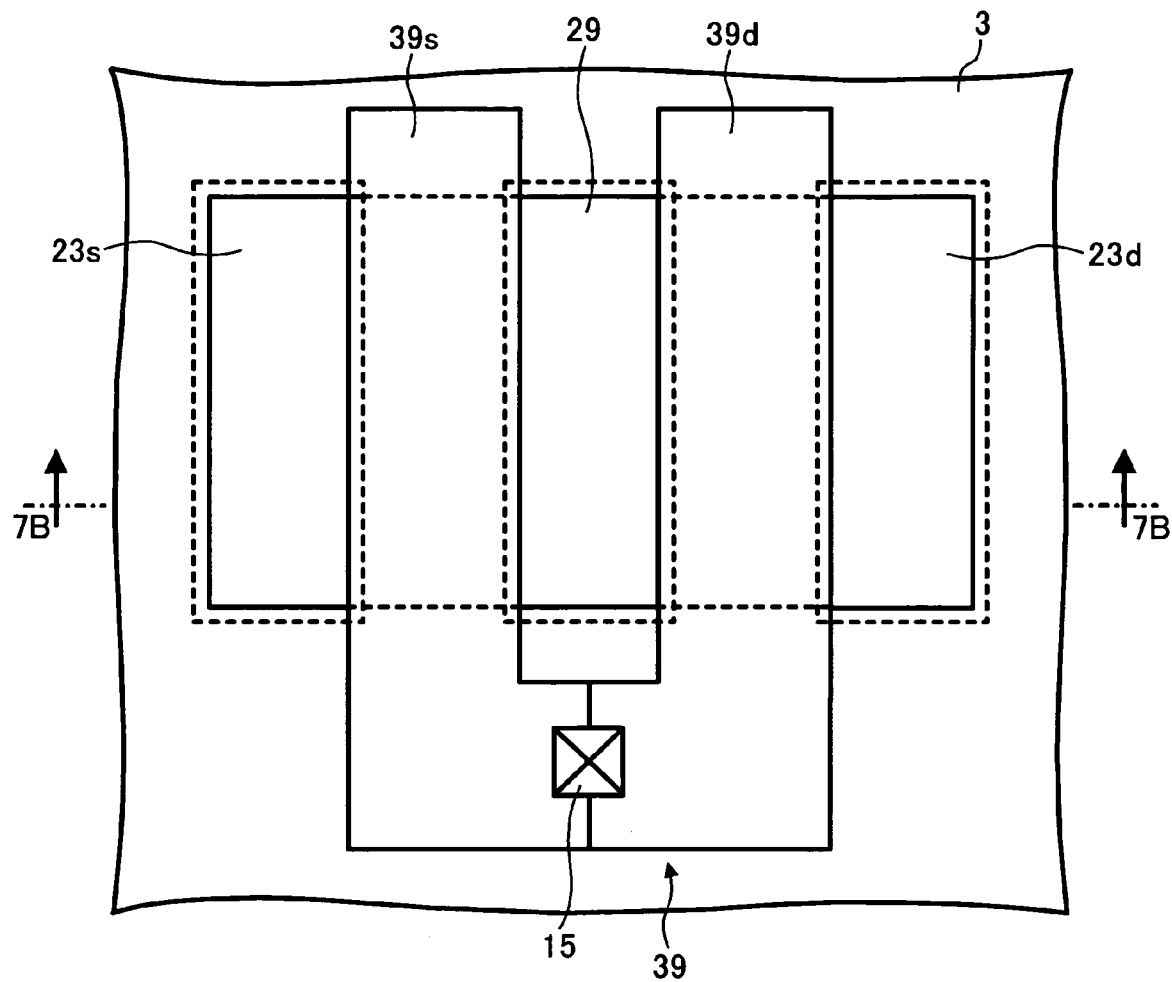
FIG. 7A is a plan view of an exemplary semiconductor apparatus, according to still another embodiment of the present invention.
Figure 7B:
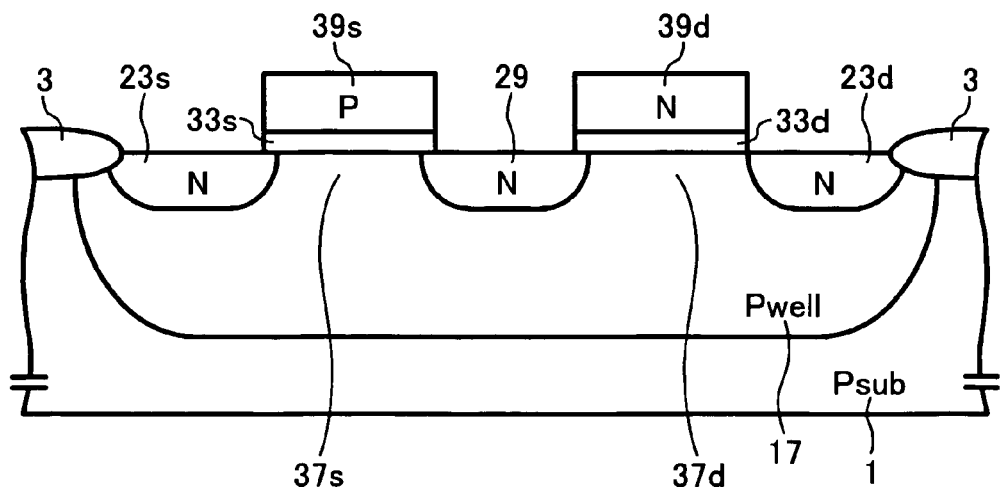
FIG. 7B is a sectional view of the exemplary semiconductor apparatus when viewed along the line 7B-7B illustrated in FIG. 7A.

Still another exemplary embodiment of the present invention is now described with reference to FIGS. 7A and 7B, wherein the present invention is realized in an Nch-MOS transistor.

As shown, a LOCOS oxide film 3 is preferably formed on a surface of a P-type semiconductor substrate 1. A P-well region 17 is preferably formed in an element device formation region on the semiconductor substrate 1. A drain 23d receiving implantation of N-type impurity, an N-type impurity diffusion zone 29, and a source 23s are preferably separately formed on a surface of the P-well region 17.

A drain side gate oxide film 33d is preferably formed on the P-well region 17 between a drain 23d and an N-type impurity diffusion zone 29 to serve as a drain side channel region 37d. A source side gate oxide film 33s is preferably formed on the P-well region 17 between the source 23s and the N-type impurity diffusion zone 29 to serve as a source side channel region 37s. Densities of the channel impurity of the channel regions 37d and 37s may be substantially the same.

An annular drain side gate electrode 39d made of poly-silicon receiving implantation of N-type impurity is preferably formed on the drain side electrode 39d while extending to the LOCOS oxide film 3. An annular source side gate electrode 39s made of poly-silicon receiving implantation of P-type impurity may preferably be formed on the gate oxide film 33s while extending to the LOCOS oxide film 3.

The gate electrodes 39d and 39s are preferably continuously formed on the LOCOS oxide film 3 so as to collectively form the gate electrode 39. An ohmic contact region 15 may be formed on the gate electrode 39 on the LOCOS oxide film 3 while overstriding the gate electrodes 39d and 39s. These gate electrodes 39d and 39s may receive substantially the same voltages.

Since the channel regions 37d and 37s are the P-types, the source side gate electrode 39s with implantation of P-type impurity may have a larger work function than that of the drain side gate electrode 39d with implantation of N-type impurity.

Accordingly, a threshold of a source side MOS transistor formed from the N-type impurity diffusion zone 29, the source 23s, the channel region 37s, the gate oxide film 33s, and the gate electrode 39s may be higher than that of a drain side MOS transistor formed from the drain 23d, the N-type impurity diffusion zone 29, the channel region 37d, the gate oxide film 33d, and the gate electrode 39d.

Figure 6B:
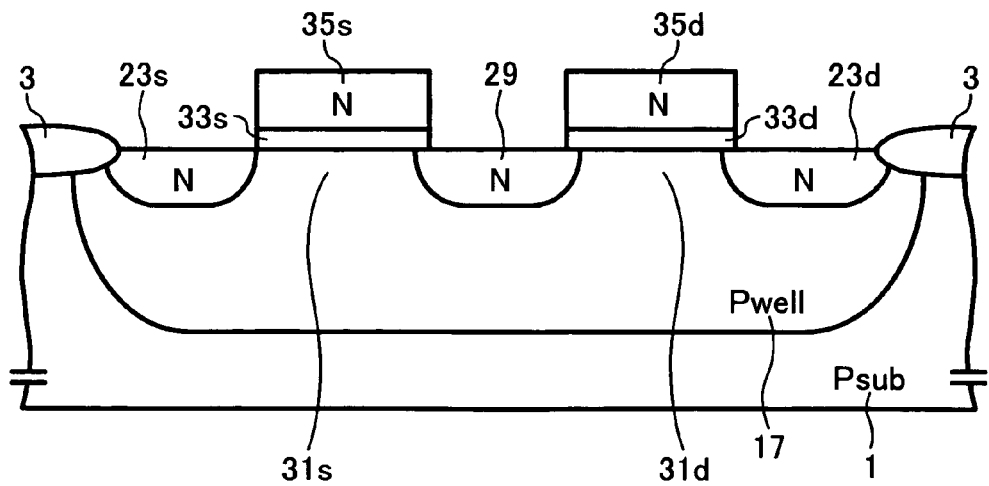
FIG. 6B is a sectional view of the semiconductor apparatus when viewed along the line 6B-6B illustrated in FIG. 6A.

Hence, similar to the embodiment mentioned with reference to FIG. 6, this embodiment improves the λ performance because it can be assumed that the MOS transistor with a high current drive performance of the drain side is serially connected to that with a low current drive performance of the source side while commonly using the N-type impurity diffusion zone 29.

In addition, since the gate electrode 39 is preferably formed in the drain side gate electrode 39d and the source side gate electrode 39s, separately, an unevenness of performance likely caused by displacement of photoengraving can be minimized or omitted when compared with the embodiment of FIGS. 4A and 4B that commonly employs the gate electrode having neighboring P and N-type regions in the channel longitudinal direction.

Figure 8A:
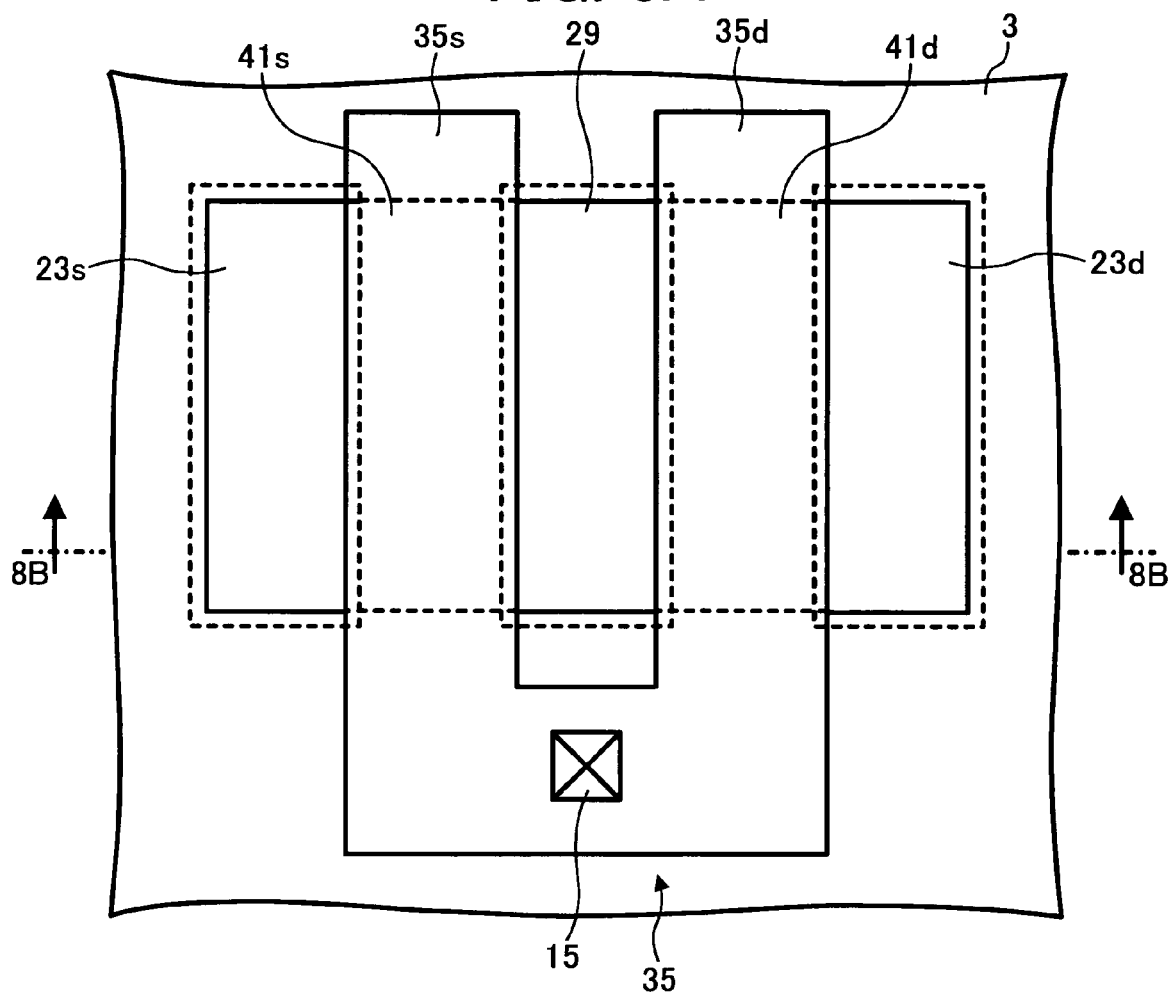
FIG. 8A is a plan view of an exemplary semiconductor apparatus, according to still another embodiment of the present invention.
Figure 8B:
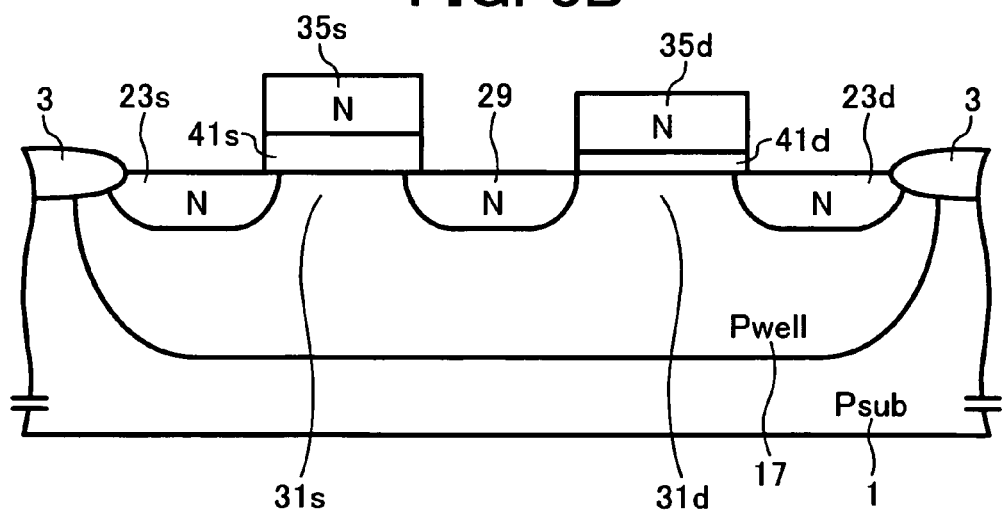
FIG. 8B is a sectional view of the exemplary semiconductor apparatus when viewed along the line 8B-8B illustrated in FIG. 8A.

Still another exemplary embodiment is now described with reference to FIGS. 8A and 8B, wherein the present invention is realized in an Nch-MOS transistor.

As shown, a LOCOS oxide film 3 is preferably formed on a surface of a P-type semiconductor substrate 1. A P-well region 17 is preferably formed on an element device formation region of the semiconductor substrate 1. A drain 23d, an N-type impurity diffusion zone 29, and a drain 23d are separately formed on a surface of the P-well region 17.

A drain side gate oxide film 41d is preferably formed on a drain side channel region 37d formed between the drain 23d and the N-type impurity diffusion zone 29. A source side gate oxide film 41s is preferably formed on a source side channel region 31s formed between the source 23s and the N-type impurity diffusion zone 29. The source side gate oxide film 41s is preferably formed thicker than the drain side gate oxide film 41d.

A drain side gate electrode 35d is preferably formed on the gate oxide film 41d while extending to the LOCOS oxide film 3. A source side gate electrode 35s is also preferably formed on the gate oxide film 41s while extending to the LOCOS oxide film 3. The gate electrodes 35d and 35s may be continuously formed on the LOCOS oxide film 3 so as to form the gate electrode 35. An ohmic contact region 15 may be formed on the gate electrode 35 on the LOCOS oxide film 3.

The source side gate oxide film 41s may be formed thicker than the drain side gate oxide film 41d. Accordingly, a threshold of a source side MOS transistor formed from the N-type impurity diffusion zone 29, the source 23s, the channel region 31s, the gate oxide film 41s and the gate electrode 35s may be higher than that of a drain side MOS transistor formed from the drain 23d, the N-type impurity diffusion zone 29, the channel region 31d, the gate oxide film 41d, and the gate electrode 35d.

Hence, similar to the embodiments mentioned with reference to FIGS. 6A to 7B, this embodiment can improve the λ performance, because it can be assumed that the MOS transistor with a high current drive performance of the drain side is serially connected to that with a low current drive performance of the source side while commonly using the N-type impurity diffusion zone 29.

In addition, since the drain side gate electrode 41d and the source side gate electrode 41s are distanced from each other, an unevenness of performance likely caused by displacement of photoengraving can be more minimized or sometimes even omitted, in contrast with the embodiment of FIGS. 5A and 5B that employs the gate oxide film having the different film thickness at the drain and source sides in the channel longitudinal direction.

In the exemplary embodiments of FIGS. 6A to 8B, the present invention is realized in the various Nch-MOS transistors. However, a Pch-MOS transistor can similarly be realized according to the present invention with similar effect if a threshold voltage of a source side MOS transistor is designed higher than that of a drain side MOS transistor by differentiating any one of source and drain side channel regions in a density of channel impurity, source and drain side gate electrodes in a work function, and source and drain side gate oxide film in a thickness.

Further, the threshold voltage of the source side MOS transistor can be designed higher than that of the drain side MOS transistor by optionally combining two or more constructions mentioned above.

The above-mentioned MOS transistor also can be employed in enhancement and depletion types.

Figure 9:
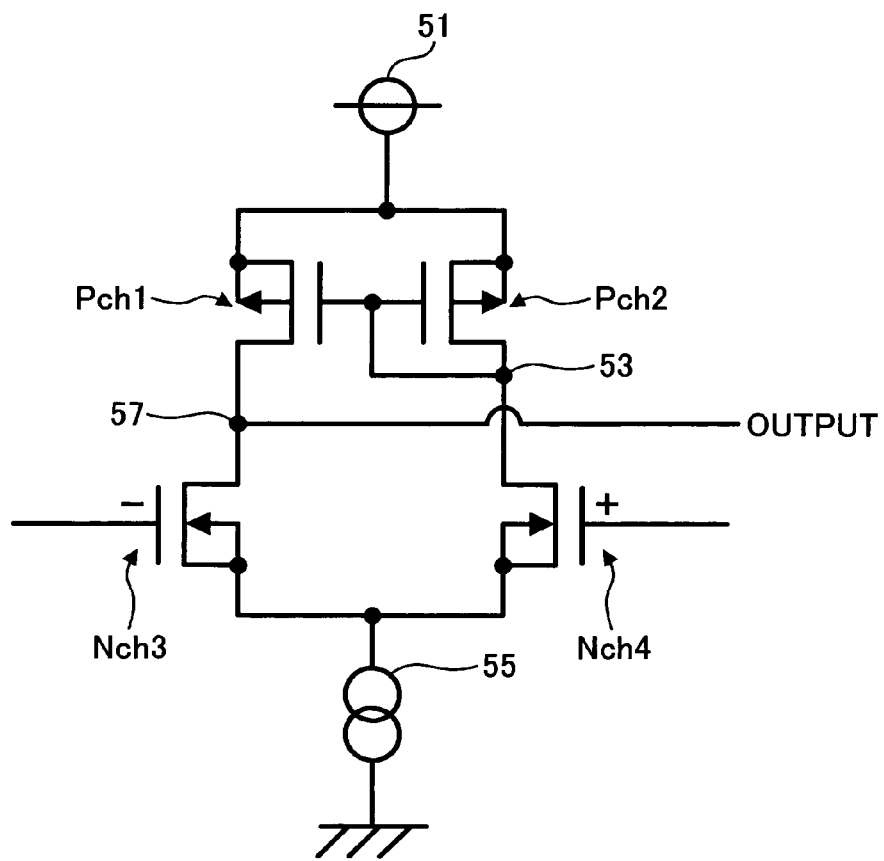
FIG. 9 illustrates an exemplary circuit of a semiconductor apparatus employing a differential amplifier circuit including a current mirror circuit as constant current load.

An exemplary embodiment of the present invention in which a semiconductor apparatus employing a differential amplifier circuit using a current mirror circuit as a constant current load is now described with reference to FIG. 9. A pair of differential input use Nch-MOS transistors Nch3 and Nch4 is preferably connected to a power supply 51 via Pch-MOS transistors Pch1 and Pch2. Gate electrodes of the Pch-MOS transistors Pch1 and Pch2 are mutually connected. These transistors Pch1 and Pch2 preferably are connected to a drain of one of input use Nch-MOS transistors, for example Nch 4, at a connection point 53, thereby collectively forming a current mirror circuit so as to serve as a constant current load.

A gate electrode of the Nch-MOS transistor Nch3 is preferably connected to an inversion input terminal (−) of a differential amplifier circuit. A gate electrode of the Nch-MOS transistor Nch4 is preferably connected to a non-inversion input terminal (+). Sources of the Nch-MOS transistors Nch3 and Nch4 are grounded via constant current source 55. A connection point 57 of the Pch-MOS and Nch-MOS transistors Pch1 and Nch3 may serve as an output terminal of an operation amplifier.

An operation of the differential amplifier circuit is now described, wherein a voltage of the inversion input terminal (−) is supposed to be constant. When a voltage of the non-inversion input terminal (+), namely a gate voltage of the Nch-MOS transistor Nch4, increases, a current flowing through the Nch-MOS transistor Nch4 increases, a voltage decreases at the connection point 53, gate voltages of the Pch-MOS transistors Pch1 and Pch2 also decrease, currents flowing through the Pch-MOS transistors Pch1 and Pch2 increase, and a current also increases at the connection point 57. Since the voltage of the inversion input terminal (−), i.e., the gate voltage of the Nch-MOS transistor Nch3 is constant, a turning ON resistance of the Nch-MOS transistor Nch3 may be constant. Thus, when the current increases at the connection point 57, the voltage also increases. Accordingly, when a voltage of the non-inversion input terminal (+) increases, an output of the differential amplifier correspondingly increases.

In contrast, when a voltage of the non-inversion input terminal (+), namely a gate voltage of the Nch-MOS transistor Nch4, decreases, a current flowing through the Nch-MOS transistor Nch4 decreases, a voltage increases at the connection point 53, gate voltages of the Pch-MOS transistors Pch1 and Pch2 also increase, currents flowing through the Pch-MOS transistors Pch1 and Pch2 decrease, and a current also decreases at the connection point 57. Since a turning ON resistance of the Nch-MOS transistor Nch3 is constant, the voltage descends when the current decreases at the connection point 57. Accordingly, when a voltage of the non-inversion input terminal (+) decreases, an output of the differential amplifier correspondingly decreases.

The preferred embodiment of the MOS transistor forming the semiconductor apparatus is thus realized in the Pch-MOS transistors Pch1 and Pch2 forming a current mirror circuit serving as a constant current load.

Since the MOS transistor forming the semiconductor apparatus can be formed in a relatively smaller area with an excellent λ performance, an ability of flowing substantially the same current through the Pch-MOS transistors Pch1 and Pch2 can be improved with a relatively smaller area of the current mirror circuit. Further, due to the improvement, a gain of the differential amplifier circuit can be accordingly improved.

Even if the current mirror circuit employing the MOS transistor forming the semiconductor apparatus is realized in the differential amplifier circuit in this preferred embodiment, the present invention is not limited thereto, and can be realized in the other various circuits employing a current mirror circuit.

Figure 10:
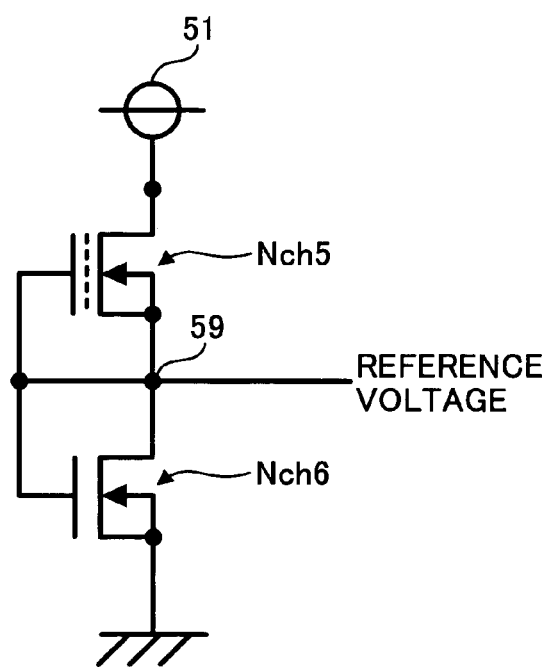
FIG. 10 illustrates an exemplary circuit of a semiconductor apparatus employing a reference voltage generating circuit.

Referring now to FIG. 10, an exemplary embodiment of the present invention in which a semiconductor apparatus employing a reference voltage generating circuit is described. A drain of an Nch-depletion type MOS transistor Nch5 is preferably connected to a power supply 51. A gate electrode is preferably connected to a source at a connection point 59. A MOS transistor Nch5 forms a constant current source. At the connection point 59, a gate electrode of an Nch-enhancement type MOS transistor Nch6 is preferably connected to its own drain. A source of the MOS transistor Nch6 is grounded. A voltage of the connection point 59 is an output of the reference voltage generating circuit.

Since the MOS transistor Nch6 operates with a constant current generated by the MOS transistor Nch5, the voltage of the connection point 59, i.e., an output of the reference voltage generating circuit, may be preferably determined by a threshold voltage of the MOS transistor Nch6.

A MOS transistor forming the semiconductor apparatus of this preferred embodiment is preferably applied to the Nch-depletion type MOS transistor Nch5 forming the constant current source. The MOS transistor is formed in a small area with an excellent λ performance. Thus, the MOS transistor of the semi-conductor apparatus of this exemplary embodiment can stably supply a current to the Nch enhancement type MOS transistor Nch6 serially connected to the Nch-depletion type MOS transistor Nch5. In addition, the output voltage of the reference voltage generation circuit can also be stable.

In the reference voltage generation circuit of this preferred embodiment, one enhancement type MOS transistor is serially connected to the depletion type MOS transistor Nch 5 as mentioned above. However, two or more MOS transistors can be connected to the depletion type MOS transistor so as to form a constant current source.

Figure 11:
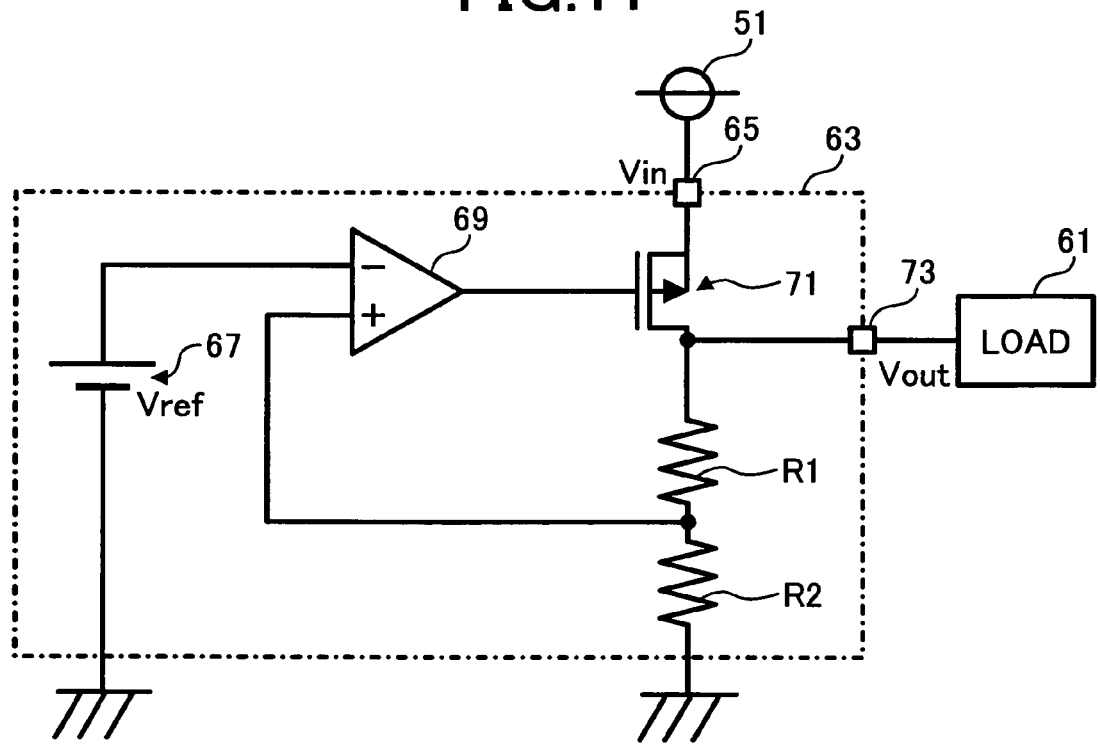
FIG. 11 illustrates an exemplary circuit of a semiconductor apparatus employing a constant voltage generating circuit.

Referring now to FIG. 11, a further exemplary embodiment of the present invention in which a semiconductor apparatus employing a constant voltage generating circuit is described. As shown, in order for a power supply 51 to stably supply a load 61 with power, a constant voltage generating circuit 63 is preferably employed. The constant voltage generating circuit 63 may include an input terminal (Vin) 65 connected to the power supply 51, a reference voltage generation circuit (Vref) 67 serving as a reference voltage source, a differential amplifier circuit 69, an output driver 71 formed from a Pch-MOS transistor, a pair of division resistances R1 and R2, and an output terminal (Vout) 73.

In the differential amplifier circuit 69, an output terminal may be connected to a gate electrode of the output driver 71. The reference voltage generation circuit (Vref) 67 supplies a reference voltage "Vref" to an inversion input terminal (−). A voltage obtained by dividing the output voltage "Vout" with the pair of division resistances R1 and R2 is applied to a non-inversion input terminal (+). The voltage divided by the division resistances R1 and R2 is controlled to be substantially the same with the reference voltage "Vref".

In the constant voltage generating circuit 63, a constant current source adopting a MOS transistor of a semiconductor, for example, and a reference voltage generation circuit similar to that described with reference to FIG. 10, constitutes the reference voltage generation circuit 67. Further, a current mirror circuit adopting a MOS transistor of a semiconductor, for example, a differential amplifier circuit similar to that described with reference to FIG. 9 constitutes the differential amplifier circuit 69.

Using the reference voltage generation circuit 67 and the differential amplifier circuit 69, since an output of the reference voltage generation circuit is stabilized, and a gain is improved, stability of the output voltage of the constant voltage generating circuit 63 can be improved.

Figure 12:
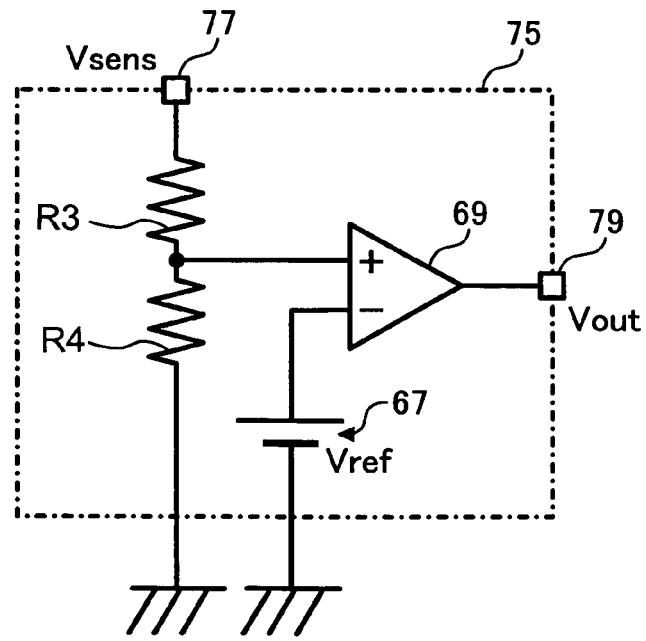
FIG. 12 illustrates an exemplary circuit of a semiconductor apparatus employing a voltage detecting circuit.

Referring now to FIG. 12, a further exemplary embodiment of the present invention in which a semiconductor apparatus employing a voltage detection circuit is described. In a voltage detection circuit 75, reference character 69 denotes an operational amplifier, in which a reference voltage generation circuit 67 is preferably connected to a non-inversion input terminal (−) so as to apply a reference voltage "Vref". A voltage of a terminal to be input from an input terminal (Vsens) 77 to be detected is preferably divided by a pair of division resistances R3 and R4, and is then input to an non-inversion input terminal (+) of the differential amplifier circuit 69. An output of the differential amplifier circuit 69 may be externally output via an output terminal (Vout) 79.

When the voltage of the terminal is high, and accordingly, a voltage divided by the pair of division resistances R3 and R4 is higher than the reference voltage Vref, the output of the differential amplifier circuit 69 approaches the High level. In contrast, the voltage of the terminal decreases, and the voltage divided by the division resistances R3 and R4 becomes lower than the reference voltage Vref, the output approaches the Low level.

A constant current source adopting a MOS transistor of a semiconductor apparatus, for example, a reference voltage generation circuit similar to that described with reference to FIG. 10 may constitute the reference voltage generation circuit 67. Further, a circuit with a current mirror circuit adopting a MOS transistor of a semiconductor apparatus, for example, a differential amplifier circuit similar to that described with reference to FIG. 9, constitutes the differential amplifier circuit 69.

According to the reference voltage generation circuit 67 and the differential amplifier circuit 69, since an output of the reference voltage generation circuit is stabilized and a gain is improved, stability of the output voltage of the voltage detection circuit 75 can be accordingly improved.

Figure 13A:
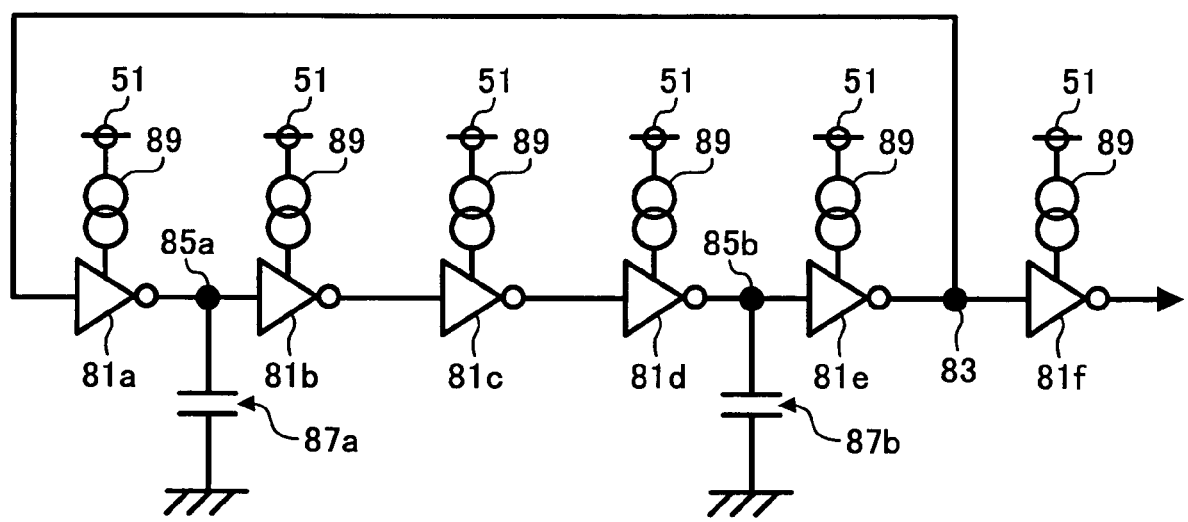
FIG. 13A illustrates an exemplary circuit of a semiconductor apparatus employing a ring oscillator.
Figure 13B:
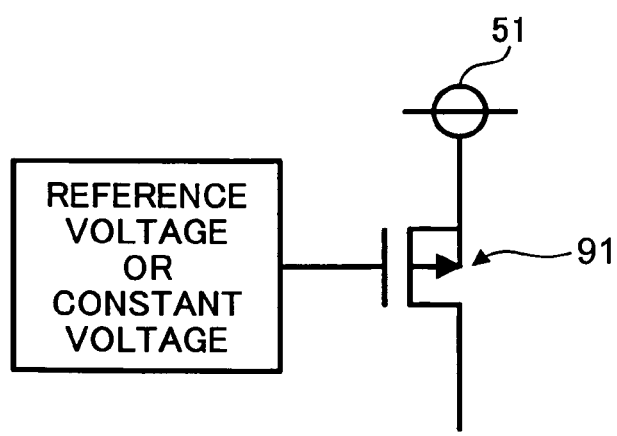
FIG. 13B illustrates a constant current source for the ring oscillator of FIG. 13A.

Referring now to FIGS. 13A and 13B, still another exemplary embodiment of the present invention in which a semiconductor apparatus including a ring oscillator is described. As shown, five inverter circuits 81a to 81e may be circularly connected. A connection point 83 between the inverter circuits 81a and 81e may be connected to the inverter circuit 81f. An output of the inverter circuit 81f serves as an output of the ring oscillator.

A connection point 85a between the inverter circuits 81a and 81b is connected to a capacitor 87a. A connection point 85b between the inverter circuits 81d and 81e is connected to a capacitor 87b. The other electrodes of the capacitors 87a and 87b are preferably grounded.

To each of the inverter circuits 81a to 81f, a current is similarly supplied from each of power supplies 51 via each of constant current sources 89. As shown in FIG. 13B, the constant current source 89 is preferably formed from a Pch-MOS transistor 91 receiving a prescribed constant voltage or a reference voltage through its gate electrode.

An oscillation frequency may be determined based upon a current value supplied to the inverter circuits 81a to 81e as well as capacities of the capacitors 87a and 87b. For the Pch-MOS transistor 91 that forms the constant current source 89, a MOS transistor mentioned heretofore may be adopted.

Further, the current supplied to the respective inverter circuits 81a to 81e may be required to be independent from a change in a voltage of the power supply 51. According to the MOS transistor of the semiconductor apparatus of the preferred embodiment, since a λ performance can be improved, the current to be supplied to the inverter circuits 81a to 81f can be stabilized by the constant current source 89, and oscillation of the ring oscillator can also be stabilized.

Numerous additional modifications and variations of the present invention are possible in light of the above teachings. It is therefore to be understood that within the scope of the appended claims, the present invention may be practiced otherwise than as specifically described herein.

What is claimed is:

1. A semiconductor apparatus including a MOS transistor, said MOS transistor comprising:
    a semiconductor substrate configured to provide a channel region between a source and a drain;
    an impurity diffusion layer formed between the source and drain; and
    a gate electrode formed over the semiconductor substrate and over a gate oxide film;
    wherein a source side of the channel region has a first channel impurity density and a drain side of the channel region has a second channel impurity density different from the first channel impurity density, the difference in channel impurity density producing a threshold voltage of the source side region of the MOS transistor which is higher than that of the drain side region in a longitudinal direction of the channel region;
    wherein said channel region is formed from a drain side channel region being formed between the drain and the impurity diffusion layer, and the source side channel region being formed between the impurity diffusion layer and the source;
    wherein said gate electrode includes a drain side gate electrode formed on the drain side channel region via a drain side gate oxide film, and a source side gate electrode formed on the source side channel region via a source side gate oxide film;
    wherein said source side region at least includes the source, the impurity diffusion layer, the source side channel region, the source side gate oxide film, and the source side gate electrode so as to collectively form a source side MOS transistor; and
    wherein said drain side region at least includes the drain, the impurity diffusion layer, the drain side channel region, the drain side gate oxide film, and the drain side gate electrode so as to collectively form a drain side MOS transistor.

2. The semiconductor apparatus according to claim 1, wherein said threshold voltage of the source side region is designed higher by differentiating the gate electrode in the source and drain side regions in a work function in the channel longitudinal direction.

3. The semiconductor apparatus according to claim 1, wherein said threshold voltage of the source side region is designed higher by differentiating the gate oxide film in the source and drain side regions in a film thickness in the channel longitudinal direction.

4. The semiconductor apparatus according to claim 1, wherein said source and drain side gate electrodes are different in a work function from each other.

5. The semiconductor apparatus according to claim 1, wherein said source and drain side gate oxide films are different in a thickness from each other.

* * * * *